United States Patent [19]

Becker et al.

[11] Patent Number: 4,782,036

[45] Date of Patent: Nov. 1, 1988

[54] PROCESS FOR PRODUCING A PREDETERMINED DOPING IN SIDE WALLS AND BASES OF TRENCHES ETCHED INTO SEMICONDUCTOR SUBSTRATES

[75] Inventors: Frank Becker, Munich; Erwin Hopf, Unterhaching, both of Fed. Rep. of Germany

[73] Assignee: Siemens Aktiengesellschaft, Berlin and Munich, Fed. Rep. of Germany

[21] Appl. No.: 74,332

[22] Filed: Jul. 16, 1987

[30] Foreign Application Priority Data

Aug. 29, 1986 [DE] Fed. Rep. of Germany ....... 3629393

[51] Int. Cl.$^4$ .......................................... H01L 21/385
[52] U.S. Cl. ..................... 437/164; 437/52; 437/919
[58] Field of Search ................. 457/164, 163, 919, 52

[56] References Cited

U.S. PATENT DOCUMENTS 3,200,019  8/1965  Scott, Jr. et al. ............... 437/164 X
3,247,032  4/1966  Griswold ......................... 437/164 X
3,514,846  6/1970  Lynch .............................. 437/164 X
4,102,715  7/1978  Kambara et al. ............... 437/164 X
4,397,075  8/1983  Fatula, Jr. et al. .............. 437/52 X
4,569,701  2/1986  Oh ................................... 437/67 X
4,645,564  2/1987  Morie et al. ..................... 437/919 X

*Primary Examiner*—George T. Ozaki
*Attorney, Agent, or Firm*—Hill, Van Santen, Steadman & Simpson

[57] ABSTRACT

A process for producing a predetermined doping level in side walls and bases of trenches which have been etched into semiconductor substrates which involves treating the substrate with a gaseous atmosphere containing organic compounds of silicon, oxygen and boron in amounts sufficient to form a boron silicate glass, thermally decomposing the organic compounds to form the boron silicate glass as a layer deposit along the side walls and the bases and thereafter diffusing the layer deposit into the side walls and the base. This is followed by removing the layer deposit remaining after the predetermined amount of diffusion has taken place.

3 Claims, 1 Drawing Sheet

PROCESS FOR PRODUCING A PREDETERMINED DOPING IN SIDE WALLS AND BASES OF TRENCHES ETCHED INTO SEMICONDUCTOR SUBSTRATES

BACKGROUND OF THE INVENTION

1. Field of the Invention

The present invention is in the field of producing controlled dopings in side walls and at the bottom of trenches etched into semiconductor substrates by diffusing a dopant out of a layer which has been deposited in the trenches and which contains the dopant.

2. Description of the Prior Art

Doped trenches of the type with which the present invention is concerned form the basis of capacitor storage cells (trench cells) which, because of their small space requirements, are used in highly integrated semiconductor circuits as DRAM stores (dynamic random access memory) in order to gain additional space.

The trench cells require a high level of doping which has previously been produced by p-trough technology in which ions of the dopant, accelerated in an electric field, are implanted into zones of the semiconductor substrate by a masking technique.

A method of producing a phosphorus doping in the walls and at the bottom of trench cells is described, for example, in an article by Morie et al appearing in IEEE, 1983, pages 411 to 414. In this disclosure, a phosphorus silicate glass (PSG) is deposited in the trenches which have been etched into the substrate by the chemical deposition of phosphine ($PH_3$) and silane ($SiH_4$) in an oxygen atmosphere from which the phosphorus diffuses into the substrate at high temperatures.

These processes have a number of disadvantages. An additional masking step is required for the p-trough technique. In order to attain deep trough depths, a high temperature process is necessary, lasting for many hours, and which nevertheless leads to a dopant concentration which diminishes considerably in the direction of the trench base. A similarly unfavorable concentration gradient occurs when PSG layers are diffused in accordance with the above described process due to the fact that the PSG layer becomes thinner with increasing trench depth. This gradient reduces the maximum capacitance attainable in the trench cell and leads to a high degree of sensitivity to leakage currents.

SUMMARY OF THE INVENTION

The object of the present invention is to provide a doping process for use in trenches, which permits a high level of doping with boron, is simple to perform, and can be well monitored without exhibiting the disadvantages of the known processes.

This object is fulfilled in a process of the type described in which a layer of boron silicate glass is deposited by thermal decomposition from a gas phase of organic compounds containing silicon, oxygen and boron.

In a preferred form of the present invention, the silicate glass layer is formed by decomposition of the organic compounds tetraethylorthosilicate (TEOS), $(C_2H_5O)_4Si$ and trimethylborate (TMB), $(CH_3O)_3B$ at a temperature of 600° to 700° C. and at a pressure of 0.1 to 2 mbar. The diffusion preferably takes place at 900° to 1050° C. for a time normally running from 20 minutes to 2 hours.

In comparison to prior art techniques, the process of the present invention has the following advantages:

1. As a result of the good edge coverage of the BSG layer in accordance with the TEOS process, thinning of the layer at the critical locations is avoided and thus a uniform concentration of the dopant source ions is insured.
2. Even with a high aspect ratio (for example, a trench having a depth of 5 um and a width of 1 um) no reduction occurs in the layer thickness and thus in the dopant concentration in the direction of the trench base.
3. A uniform doping profile can be produced with an optimum penetration depth of the boron atoms of 0.5 um.
4. The strength and the profile of the doping can be easily controlled by means of the boron content of the BSG layer, the temperature, and the diffusion time.
5. The process can be performed simply and rapidly and is also self-adjusting since no additional masking step is required.

BRIEF DESCRIPTION OF THE DRAWINGS

The invention will be explained in detail in the form of an exemplary embodiment, with reference to FIGS. 1 to 3 which are cross-sectional diagrams of the essential process steps of the present invention. In the figures, identical reference numerals have been used for identical components.

DESCRIPTION OF THE PREFERRED EMBODIMENTS

Figure 1:
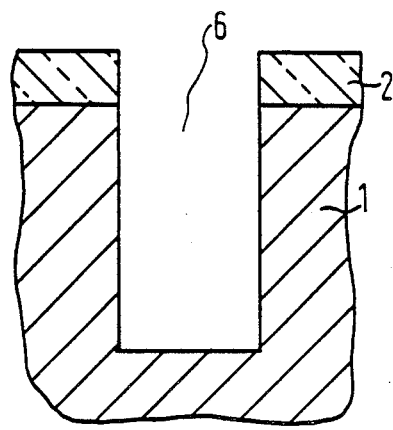

FIG. 1 illustrates a trench 6 which, for example, has a depth of 5 um and a width of 1 um and which has been etched into a semiconductor substrate 1 which consists of silicon and which has been covered with a silicon oxide layer 2.

Figure 2:
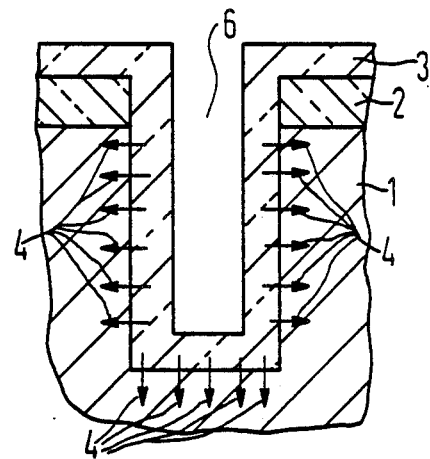

FIG. 2 is a diagram of the boron silicon glass layer 3 which has been deposited into the trench 6 by decomposition from the gas phase of tetraethylorthosilicate and trimethylborate at a temperature of 650° C. and a pressure of 0.5 mbar. The composition of the BSG layer is controlled by means of controlling the mass flow velocities of the carrier such as oxygen or nitrogen, and by means of the vaporization temperatures.

Further details of the reactor which is used for the deposition may be found in German Patent Application No. P3518452.3 (European Patent Application No. 0 204 182 and U.S. Ser. No. 3,855,399).

By heating the substrate having the BSG layer thereon at a temperature of 950° C., boron atoms as shown by the arrows 4 are diffused into the substrate 1. The quantity of the diffusion is controlled by the diffusion time which ranges between 20 minutes and 2 hours. Then the BSG layer 3 is removed by wet etching using buffered hydrofluoric acid. The etching process exhibits a high level of selectivity in relation to silicon.

Figure 3:
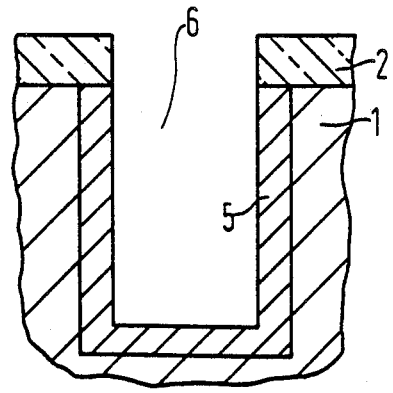

FIG. 3 is an enlarged cross-sectional view of the trench 6 whose bottom and walls are now provided with a predetermined amount of p-doping 5. The distribution of the boron atoms in the doped zone 5 has been found to be extremely uniform.

It should be evident that various modifications can be made to the described embodiments without departing from the scope of the present invention.

We claim as our invention:

1. A process for producing a predetermined doping level in the side walls and base of a trench etched into a semiconductor substrate which comprises:

treating said substrate with a gaseous atmosphere containing tetraethylorthosilicate and trimethylborate in amounts sufficient to form a boron silicate glass, thermally decomposing said organic compounds at a temperature in the range from 600° to 700° C. and a pressure of 0.1 to 2 mbar to form said boron silicate glass as a layer deposit along said side walls and said bottom, diffusing said layer dopant into said side walls and said bottom, and removing the layer deposit remaining after the predetermined amount of diffusion has taken place.

2. A process according to claim 1 wherein the diffusing takes place at temperatures of from 900° to 1050° C.

3. A process according to claim 2 wherein the diffusing takes place for a time of from 20 minutes to 2 hours.

* * * * *